United States Patent
Das et al.

(10) Patent No.: US 10,804,904 B1
(45) Date of Patent: Oct. 13, 2020

(54) APPARATUS AND METHOD FOR DETECTING SYNCHRONIZATION LOSS IN MULTI-LANE TRANSMITTER

(71) Applicant: SAMSUNG ELECTRONICS CO., LTD., Suwon-si (KR)

(72) Inventors: Tamal Das, Kalyani (IN); Nageswara Rao Kunchapu, Martur (IN); Umamaheswara Reddy Katta, Bodavada (IN)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/725,580

(22) Filed: Dec. 23, 2019

(30) Foreign Application Priority Data

Oct. 10, 2019 (IN) .............................. 201941040942

(51) Int. Cl.
*H03L 7/08* (2006.01)
*H03K 19/20* (2006.01)
(52) U.S. Cl.
CPC ................ *H03L 7/08* (2013.01); *H03K 19/20* (2013.01)
(58) Field of Classification Search
None
See application file for complete search history.

(56) References Cited

U.S. PATENT DOCUMENTS

| 7,512,238 | B2 | 3/2009 | Graunke |
| 9,015,357 | B2 | 4/2015 | Hunkins et al. |
| 9,042,431 | B1* | 5/2015 | Yadavalli ................ H04L 1/243 |
| | | | 375/221 |
| 9,319,239 | B2 | 4/2016 | Bahren et al. |
| 2014/0047158 | A1* | 2/2014 | Frans .................... G06F 3/0658 |
| | | | 711/102 |
| 2017/0117979 | A1 | 4/2017 | Sengoku et al. |
| 2017/0127363 | A1* | 5/2017 | Tamamoto ............ H04W 72/04 |

* cited by examiner

*Primary Examiner* — Cassandra F Cox
(74) *Attorney, Agent, or Firm* — Sughrue Mion, PPLC (57) ABSTRACT

A multi-lane transmitter and method of detecting a sync loss are provided. The method includes generating a high-speed clock signal and a sync reset signal synchronized to the high-speed clock signal. A sync loss pulse is generated based on the high-speed clock signal, and the sync loss pulse is provided to each of plural serializer circuits. Each serializer circuit generates a sampled sync loss signal by sampling the sync loss pulse in accordance with a parallel clock signal, and a Boolean value is assigned to the sampled sync loss signal and output. A logic block detects a sync loss when the sampled sync loss signal of any serializer circuit is out of sync from the sync loss pulse based on the Boolean value.

20 Claims, 11 Drawing Sheets

APPARATUS AND METHOD FOR DETECTING SYNCHRONIZATION LOSS IN MULTI-LANE TRANSMITTER

CROSS-REFERENCE TO RELATED APPLICATION

This application claims priority from Indian Patent Application No. 201941040942, filed on Oct. 10, 2019 in the Indian Patent Office, the entire contents of which is herein incorporated by reference in its entirety.

BACKGROUND

1. Field

The present disclosure relates to a multi-lane transmitting apparatus for serial interface applications, and more particularly to a method of detecting synchronization loss in multi-lane transmitters.

2. Description of Related Art

High-speed transmitting apparatuses are used in serial interface applications for converting parallel data to serial data. Many applications ranging from display devices to wireless infrastructure transceivers require high speed serial interfaces for serializing parallel data (typically ranging from 4 Gbps). A related art high-speed transmitting apparatus includes a plurality of lanes (data lanes) in a Physical layer (PHY), each lane capable of serializing the parallel data at high speed.

In serializing parallel data at a high speed in the Physical layer (PHY), it is essential for all the data lanes to be synchronized. The different lanes are typically synchronized to the slowest lane. The different lanes on a receiving device receive data segments of a data frame at different times. However, a complete data frame is only transmitted from one layer to another after the last data word has arrived at the receiving device and the receiving device is then able to accept the data. This delay in transmission can cause latency in high-speed communications between devices causing additional undesirable latency. Many solutions have been proposed to synchronize the data lanes to a common high-speed data rate.

During an Electro-static Discharge (ESD), the transmitting apparatus can experience an electrical surge, causing the data lanes to begin transmitting signals un-synchronously. Hence, after an ESD event, all the data lanes may not be synchronized. Further, if the ESD event occurs in one data lane, only that data lane is un-synchronized with rest of the data lanes.

SUMMARY

According to an aspect of an embodiment, there is provided a method of detecting synchronization (sync) loss in a multi-lane transmitting apparatus for a high speed serial interface application, wherein the multi-lane transmitting apparatus comprises a Phase Locked Loop (PLL) circuit, a plurality of serializer circuits, a common clock divider circuit and a logic block, the method comprising generating, by the PLL circuit, a high-speed clock signal and a sync reset signal synchronized to the high-speed clock signal; generating, by the common clock divider circuit, a sync loss pulse based on the high-speed clock signal, wherein the sync loss pulse is provided to each of the plurality of serializer circuits; generating, by each of the plurality of serializer circuits, a sampled sync loss signal by sampling the sync loss pulse in accordance with a parallel clock signal, wherein a Boolean value is assigned to the sampled sync loss signal and output; detecting, by the logic block, a sync loss in the multi-lane transmitting apparatus when a sampled sync loss signal of at least one serializer circuit of the plurality of serializer circuits is out of sync from the sync loss pulse based on the Boolean value.

According to another aspect of an embodiment, there is provided a multi-lane transmitting apparatus for detecting synchronization (sync) loss, the multi-lane transmitting apparatus comprising a Phase Locked Loop (PLL) circuit configured to generate a high-speed clock signal, and a sync reset signal synchronized to the high-speed clock signal; a plurality of serializer circuits, each serializer circuit comprising a parallel clock generator and configured to serialize a plurality of parallel data into serial data, generate a sampled sync loss signal by sampling a sync loss pulse in accordance with a parallel clock signal generated by the parallel clock generator, and assign a Boolean value to the sampled sync loss signal and output the Boolean value; a common divider circuit configured to generate the sync loss pulse based on the high-speed clock signal, wherein the sync loss pulse is provided to each of the plurality of serializer circuits; and a logic block configured to detect a sync loss in the multi-lane transmitting apparatus when a sampled sync loss signal of at least one serializer circuit is out of sync from the sync loss pulse based on the Boolean value output from each serializer circuit, wherein the sync reset signal is provided to each serializer circuit in response to detecting the sync loss, and wherein in response to receiving the sync reset signal, each serializer circuit is configured to operate from a predefined operating state.

According to another aspect of an embodiment, there is provided a method of detecting synchronization (sync) loss in a multi-lane transmitting apparatus for high speed serial interface application, wherein the multi-lane transmitting apparatus comprises a Phase Locked Loop (PLL) circuit, a logic block, a plurality of lanes. each lane comprising a serializer circuit, a clock divider circuit, and a parallel clock generator, the method comprising generating, by the PLL circuit, a high-speed clock signal and a sync reset signal synchronized to the high-speed clock signal, wherein the high-speed clock signal is provided to each serializer circuit; generating, by a first clock divider circuit of a first lane of the plurality of lanes, a sync loss pulse based on the high-speed clock signal, wherein the sync loss pulse is sampled to generate a first sampled sync loss signal and the first sampled sync loss signal is provided to a second clock divider circuit of a second lane of the plurality of lanes connected in series with the first lane; generating, by the second clock divider circuit, a second sampled sync loss signal by sampling the first sampled sync loss signal received from the first clock divider circuit using a parallel clock signal of the second lane, wherein each of the first sampled sync loss signal and the second sampled sync loss signal is assigned a Boolean value; and detecting, by a logic block associated with the second lane, a sync loss in the second lane when the second sampled sync loss signal is out of sync from the first sampled sync loss signal based on the Boolean value assigned to the first sampled sync loss signal and the Boolean value assigned to the second sampled sync loss signal.

According to another aspect of an embodiment, there is provided a multi-lane transmitting apparatus for detecting synchronization (sync) loss for high speed serial interface application, the multi-lane transmitting apparatus comprising a logic block; a plurality of lanes, each lane comprising a serializer circuit, a clock divider circuit, and a parallel clock generator; and a Phase Locked Loop (PLL) circuit configured to generate a high-speed clock signal and a sync reset signal synchronized to the high-speed clock signal, wherein the high-speed clock signal and the sync reset signal are provided to each serializer circuit, wherein a clock divider circuit of a first lane is configured to generate a sync loss pulse based on the high-speed clock signal, wherein the sync loss pulse is sampled to generate a first sampled sync loss signal and the first sampled sync loss signal is provided to a clock divider circuit of a second lane connected in series with the first lane, wherein the clock divider circuit of the second lane is configured to generate a second sampled sync loss signal by sampling the first sampled sync loss signal using a parallel clock signal of the second lane, wherein each of the first sampled sync loss signal and the second sampled sync loss signal is assigned a Boolean value and the Boolean value is output to the logic block, and wherein the logic block is associated with the second lane and configured to detect a sync loss in the second lane when the second sampled sync loss signal is out of sync from the first sampled sync loss signal based on the Boolean value assigned to the first sampled sync loss signal and the Boolean value assigned to the second sampled sync loss signal.

BRIEF DESCRIPTION OF THE DRAWINGS

The above and other aspects will be understood by reference to the following detailed description in conjunction with the accompanying drawings, in which.

DETAILED DESCRIPTION

In the present specification, the word "exemplary" is used herein to mean "serving as an example, instance, or illustration." Any embodiment or implementation of the present subject matter described herein as "exemplary" is not necessarily to be construed as preferred or advantageous over other embodiments.

While the disclosure is susceptible to various modifications and alternative forms, specific embodiments thereof have been shown by way of example in the drawings and will be described in detail below. It should be understood, however that it is not intended to limit the disclosure to the particular forms disclosed, but on the contrary, the disclosure is intended to cover all modifications, equivalents, and alternative falling within the scope of the disclosure and the appended claims.

The terms "comprises", "comprising", or any other variations thereof, are intended to cover a non-exclusive inclusion, such that a setup, device or method that comprises a list of components or steps does not include only those components or steps but may include other components or steps not expressly listed or inherent to such setup or device or method. In other words, one or more elements in a system or apparatus proceeded by "comprises . . . a" does not, without more constraints, preclude the existence of other elements or additional elements in the system or apparatus.

It should be appreciated by those skilled in the art that any block diagrams herein represent conceptual views of illustrative systems embodying the principles of the present subject matter. Similarly, it will be appreciated that any flow charts, flow diagrams, state transition diagrams, pseudo code, and the like represent various processes which may be substantially represented in a computer readable medium and executed by a computer or processor, whether or not such computer or processor is explicitly shown. The processor may include one or more microprocessors. In the accompanying drawings, like reference numerals represent like elements throughout.

As discussed above, during an Electro-static Discharge (ESD), the transmitting apparatus may experience an electrical surge, causing the data lanes to begin transmitting signals un-synchronously. A few solutions have been proposed to synchronize the data lanes. For example, in a multi-lane transmitter according to one approach, a high-speed clock signal and a plurality of divided clock signals are broadcasted to the data lanes from a Phase Locked Loop (PLL) circuit. The plurality of divided clock signals (/5, /10, /20) is generated by a common clock divider. When the ESD event occurs, the common clock divider may go out of a state sequence. The common clock divider may return to a predefined state thereby synchronizing the plurality of lanes to transmit data from the predefined state. However, as a data rate of the transmitting apparatus increases, a complexity of routing all the clock signals from the common clock divider to the plurality of lanes increases. For example, if the transmitting apparatus comprises 10 data lines, and if the data rate increases from 4 Gbps to 10 Gbps, the common clock divider may have to distribute the divided clock signals to each of the 10 data lines at the data rate of 10 Gbps. Further, it is difficult to maintain timing between a Link layer of the transmitting apparatus and the Physical layer (PHY).

In a multi-lane transmitter according to another approach, a high-speed clock signal and a reset signal synchronized with the high-speed clock signal is broadcasted to each data lane. Each data lane comprises a clock divider (unlike the abovementioned approach, wherein the common clock divider divided the clock signal). Each data lane begins operating after receiving a reset signal for maintaining the synchronization. During the ESD event, flip-flops in the clock divider of each lane may enter a meta-stable state and time taken by a clock divider of one data lane is different from time taken by a clock divider of another data lane. Hence, after an ESD event, all the data lanes may not be synchronized. Further, if the ESD event occurs in one data lane, only that data lane is un-synchronized with rest of the data lanes. Also, having a clock divider in each lane is cost inefficient. Accordingly, both approaches have disadvantages.

Communication systems for transmitting data may operate according to a number of standards and implementations. One such implementation is a serializer de-serializer (SERDES) communication channel that takes a given number of data bits from a digital domain, serializes the data, and transmits the data to a receiver that deserializes the data for another digital domain. SERDES data transmission implementations may be used in a wide range of communication systems and devices, such as mobile devices, desktop computers and servers, computer networks, and telecommunication networks.

Communication systems may include multiple channels or lanes (e.g., multilane transceivers, etc.) for transmitting data, and the multiple channels or lanes introduces difficulties in aligning data and clock signals across the multiple channels. For example, clock circuitry for different channels may start up in different states and cause a skew of the data from lane to lane. The skew should be removed for synchronous operation because the skew from lane to lane may be as large as the lowest clock period. For high speed SERDES implementations, the output data rate relative to the low speed clock may cause the multi-channel skew to increase further.

Embodiments of the present disclosure relate to detecting sync loss in multi-lane transmitters. Serial interface transmission standards like high definition multimedia interface (HDMI), display port (DP) source, type-C, and the like use multi-lane transmitters and high-speed clock signals for synchronizing (syncing) a plurality of lanes.

In some embodiments, the multi-lane transmitter has multiple lanes arranged in a serial manner, each lane comprising a serializer circuit. In such implementation of the multi-lane transmitters, the sync loss may be detected by generating a sync loss pulse by a common divider circuit. The sync loss pulse is broadcasted to a plurality of lanes. The serializer circuit in each lane is configured to sample the sync loss pulse and generate a sampled sync loss signal. The sampled sync loss signal from each lane is collected by a logic block to detect if any of the sampled sync loss signals is out of sync from the sync loss pulse. Upon detecting the sync loss, a sync reset signal is broadcasted to each lane to sync the plurality of lanes. In some embodiments the common divider circuit is configured to generate the sync loss pulse having a width based on a skew margin between each serializer circuit.

In some embodiments, the multi-lane transmitter has the multiple lanes arranged in a parallel manner. In such implementations, a plurality of lanes may be arranged on either side of a phase locked loop (PLL) block. A farthest lane from the PLL block receives the sync loss pulse generated by the PLL block. The generated sync loss pulse is provided to a connected lane. The serializer in the connected lane samples the sync loss pulse received from previous lane and generates a subsequent sampled sync loss signal. Likewise, sampled sync loss signal is generated by each lane on either side of the PLL. A logic block may receive sampled sync loss signal generated by a closest lane from the PLL block, and detect a sync loss.

Figure 1:
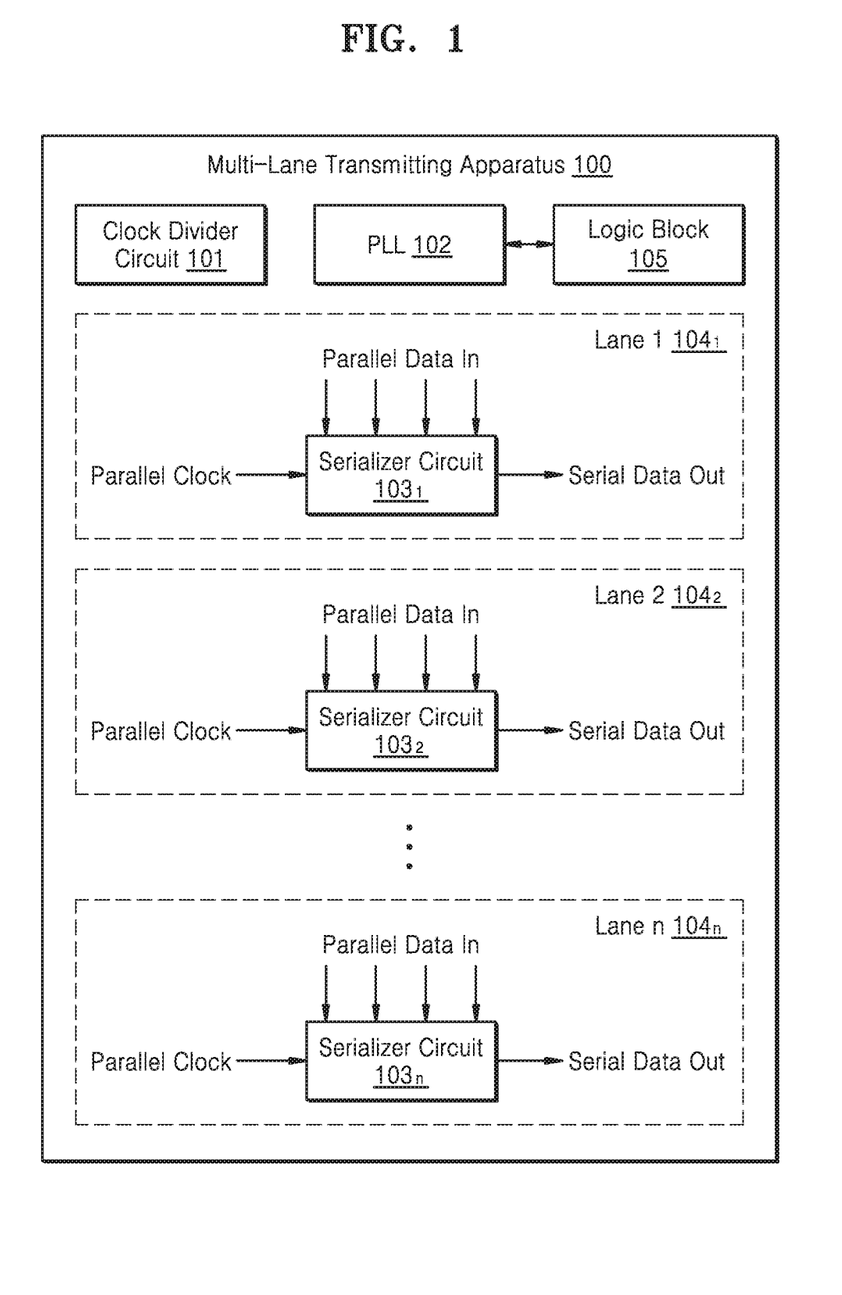
FIG. 1 shows a simplified block diagram of a multi-lane transmitting apparatus, according to some embodiments.

FIG. 1 shows a simplified block diagram of a multi-lane transmitting apparatus, according to some embodiments. The multi-lane transmitting apparatus (100) is a serializer de-serializer (SERDES) transmitter. The multi-lane apparatus (100) may follow serial interface standards including, but not limited to, HDMI, DP, type-C or any other standards including multi-lane high speed serial to parallel conversion. A person skilled in the art will understand that the multi-lane transmitting apparatus 100 may be applied in different applications, like television (TV), laptop, tablets, and any other electronic appliance having parallel to serial interface for serializing data, and may be incorporated into various types of communication systems, such as intra-computer data transmission structures (e.g., peripheral component interconnect (PCI) express bus), telecommunication networks, local area networks (LAN), wireless local area networks (WLAN), wired and wireless point-to-point connections, optical data transmission systems, and other types of communication systems using SERDES transmitters. A physical (PHY) layer of the multi-lane transmitting apparatus (100) comprises a clock divider circuit (101), a phase locked loop (PLL) (102), a logic block (105), a plurality of lanes (Lane 1 ($104_1$), Lane 2 ($104_2$), . . . Lane n ($104_n$)).

The PLL (102) may be a feedback system that generates an output signal having a phase related to a phase of an input reference signal. Generally, the PLL (102) is designed to reduce an error between the input phase and the output phase to zero. The PLL (102) is used in the multi-lane transmitting apparatus (100) for generating high-speed clock signals, and data recovery circuits (not shown). The use of PLL (102) reduces clock skew and jitter in the multi-lane transmitting apparatus (100).

In some embodiments, the multi-lane transmitting apparatus (100) may have N lanes, where N may be greater than or equal to 2. Each lane may have a corresponding parallel clock generator (not shown) to generate a parallel clock (divided clock) signal using the high-speed clock signal from the PLL (102). The respective parallel clock signals may be used as clocks to drive data (bits) on each lane. In some embodiments, the parallel clock generator may have at least one divide by 2 (/2) counter, and a divide by 5 (/5) counter. In some embodiments, the parallel clock generator may have the /2 counter, the /2 counter and the /5 counter cascaded in stages.

Each lane comprises a respective serializer circuit 103 (e.g., serializer circuit ($103_1$) of Lane 1 ($104_1$)). In some embodiments, each lane may receive P parallel bits and convert the P parallel bits into serial bits. The serializer circuits ($103_1$, . . . $103_n$) use a respective parallel clock to convert the P bits into serial bits. In some embodiments, the serializer circuits ($103_1$, . . . $103_n$) may receive 8-bit parallel input. In some embodiments, the serializer circuits ($103_1$, . . . $103_n$) may receive 16-bit parallel input. In some embodiments, the serializer circuit ($103_1$, . . . $103_n$) may receive 32-bit parallel input. In some embodiments, the serializer circuits ($103_1$, . . . $103_n$) may receive 64-bit parallel input. As used herein the term "bits" is used interchangeably with the term "data". Hence, a person of ordinary skills will understand that when the term "data" is used in the present disclosure, the term "data" means "bit" unless any other specific meaning is defined therein. In some embodiments, each lane may comprise a phase interpolator (not shown) to adjust the phase of the parallel clock of corresponding lane. The phase of a parallel clock of a lane (e.g., Lane 1 ($104_1$)) may be aligned with the parallel clock of the other lanes. Thus, the bits in each lane may be aligned with each other.

In some embodiments, the logic block (105) may comprise a phase detector (not shown) for detecting a phase difference between the lanes ($104_1, \ldots 104_n$). If any of the lanes is out of sync (having a phase difference), then the logic block (105) enables the PLL (102) to publish a sync reset signal synchronous to the high-speed clock signal to each lane. Upon resetting, each lane may operate from a predefined state. The sync reset signal is used to sync each lane ($104_1, \ldots 104_n$) of the multi-lane transmitting apparatus (100).

Figure 3A:
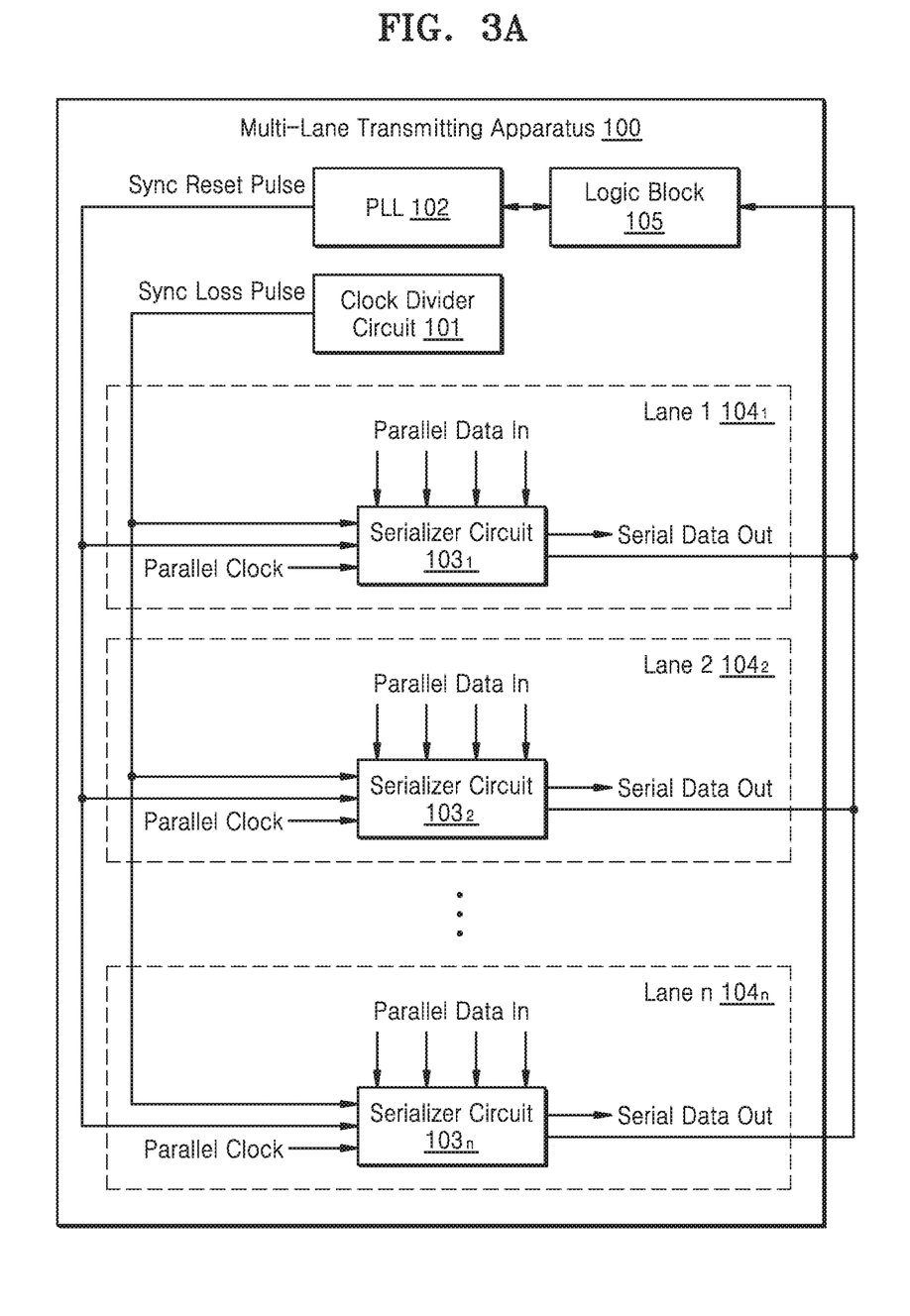
FIG. 3A shows an exemplary block diagram for detecting sync loss in a multi-lane transmitter having parallelly arranged lanes, according to some embodiments.
Figure 5:
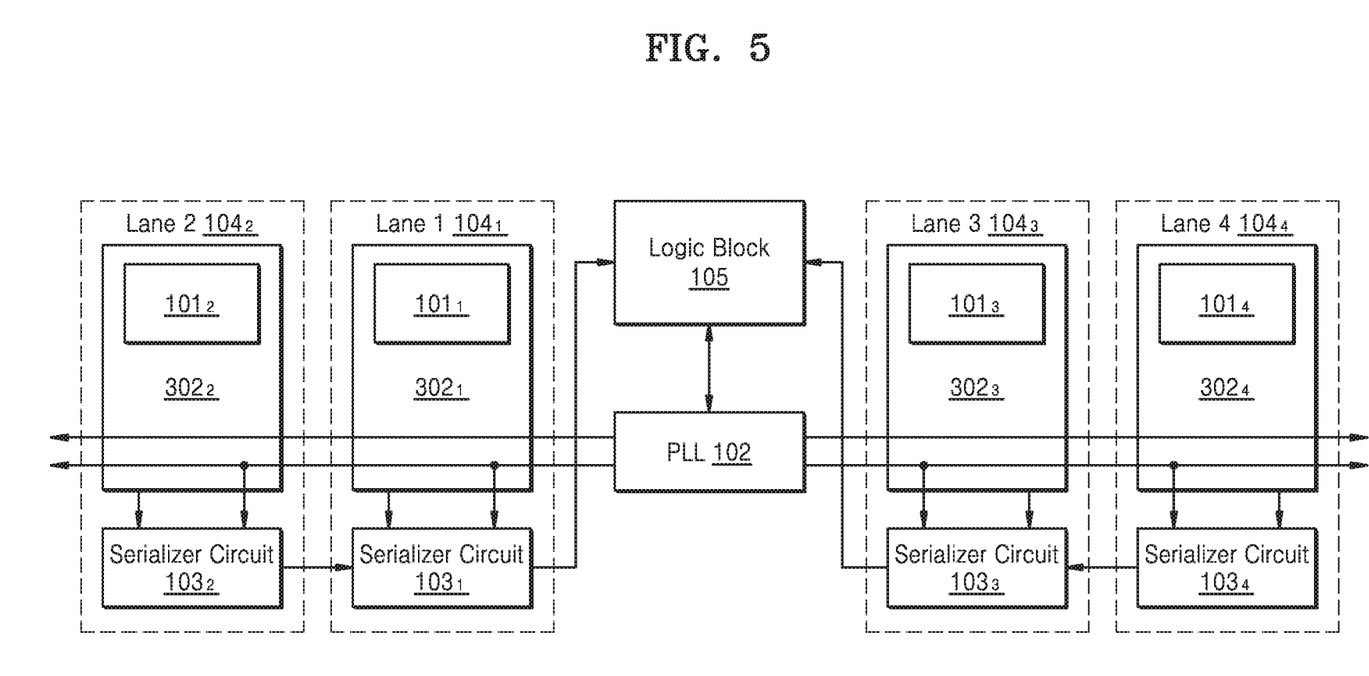
FIG. 5 shows an exemplary block diagram for detecting sync loss in a multi-lane transmitter having serially arranged lanes, according to some embodiments.

In some embodiments, the clock divider circuit (101) is configured to generate a sync loss pulse. In some embodiments, the sync loss pulse may be generated based on the parallel clock of a respective lane. For example, if Lane 1 ($104_1$) has /5, /2, /2 counters, then the sync loss pulse may be generated using the /5, /2 and /2 counters. The clock divider circuit (101) may comprise combination counter circuits to generate the sync loss pulse according to the parallel clock of the respective lanes. In some embodiments, the sync loss pulse and the parallel clock may have a same frequency to be compared against each other. For example, the counter circuits in the clock divider circuit (101) and the counter circuits generating the parallel clock may be similar. In some embodiments, the sync loss pulse may be provided to each lane, when each lane is connected in a series combination as shown in FIG. 3A. In some embodiments, the sync loss pulse may be generated by a farthest lane, when each lane is serially connected across the PLL (102) as shown in FIG. 5.

In some embodiments, the multi-lane transmitting apparatus (100) may be implemented using logic circuits. In some embodiments, the logic circuits may be implemented in hardware using electronic components, for example, transistors, resistors, capacitors, etc.

Figure 2:
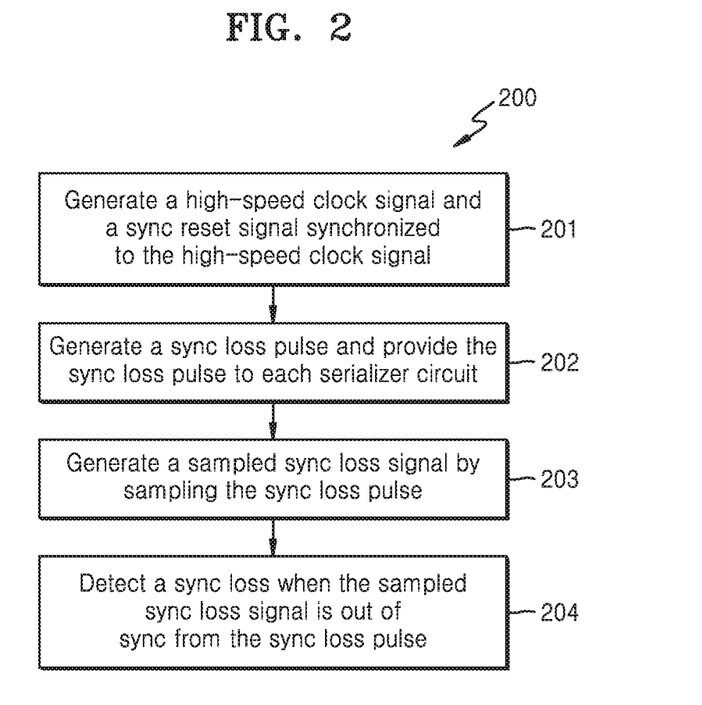
FIG. 2 shows a flowchart illustrating operations for detecting sync loss in a multi-lane transmitter having parallelly arranged lanes, according to some embodiments.

FIG. 2 shows a flowchart illustrating operations for detecting sync loss in a multi-lane transmitter having parallelly arranged lanes, according to an embodiment.

As illustrated in FIG. 2, the method (200) may comprise one or more steps. The method (200) may be described in the general context of computer executable instructions. Generally, computer executable instructions may include routines, programs, objects, components, data structures, procedures, modules, and functions, which when executed by one or more processors, perform particular functions or implement particular abstract data types.

The order of the operations of the method (200) is not intended to be construed as a limitation, and any number of the described method blocks may be combined in any order to implement the method. Additionally, individual blocks may be deleted from the methods without departing from the scope of the subject matter described herein. Furthermore, the method may be implemented in any suitable hardware, software, firmware, or combination thereof.

Figure 3B:
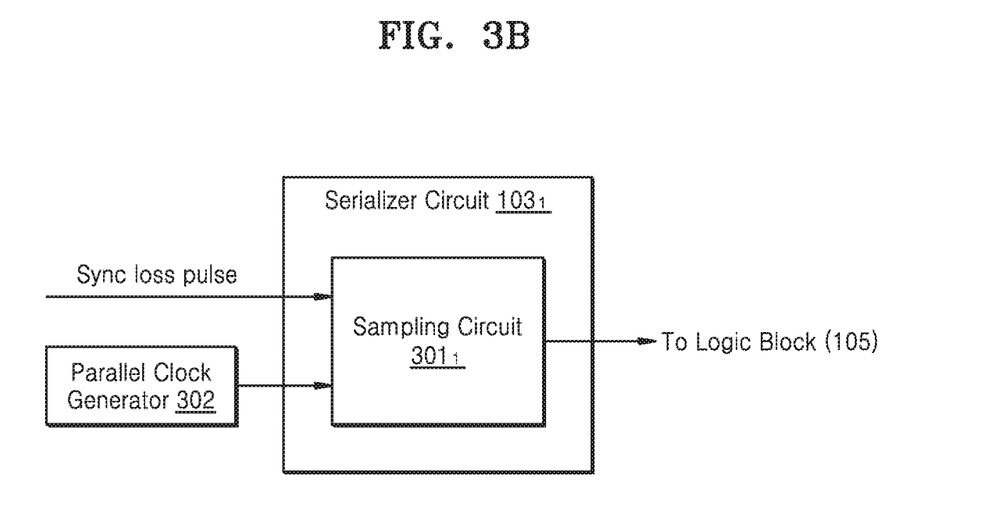
FIG. 3B shows a block diagram for sampling a sync loss pulse by a serializer circuit of a multi-lane transmitter having parallelly arranged lanes, according to some embodiments.

The method (200) may be implemented for the parallel configuration of the plurality of lanes ($104_1, \ldots 104_n$). The method steps (200) are explained in detail by making reference to FIG. 3A. The parallel configuration of the plurality of lanes ($104_1, \ldots 104_n$) are as shown in FIG. 3A. As shown in FIG. 3A, the clock divider circuit (101) is common to each lane. FIG. 3B shows a simplified block diagram of internal elements of a single lane (e.g., Lane 1 ($104_1$)). FIG. 3B is described with reference to Lane 1 ($104_1$). A person skilled in the art will understand that other lanes also comprise similar components and the description of FIG. 3B may be applicable for other lanes. As shown in FIG. 3B, each lane (e.g., Lane 1 ($104_1$)) may comprise the serializer circuit ($103_1$), and a sampling circuit (3010. In some embodiments, the serializer circuit ($103_1$) may include the sampling circuit ($301_1$) as shown in FIG. 3B. The serializer circuit ($103_1$) is configured to receive the sync loss pulse from the clock divider circuit (101) and the parallel clock from the parallel clock generator (302). The parallel clock generator (302) generates the parallel clock from the high-speed clock signal from the PLL (102) and provides the parallel clock to the serializer circuit ($103_1$). The FIG. 3B shows the parallel clock provided to the sampling circuit ($301_1$). However, it is to be noted that the parallel clock is also provided to other circuits (not shown) of the serializer circuit ($103_1$) for serializing parallel bits. The operation of the serialization of parallel bits is omitted for conciseness.

Referring now to FIG. 2, at step 201, the PLL (102) generates a high-speed clock signal and a synchronized (sync) reset signal that is synchronized to the high-speed clock signal. The high-speed clock signal and sync reset signal may be generated in a PLL (102) clock domain. As described, the PLL (102) provides the clock to sync the plurality of lanes ($104_1, \ldots 104_n$). The PLL (102) may be capable of generating a high-speed clock signal having a frequency ranging from about 1 GHz to about 5 GHz. The PLL (102) may also be configured to generate the synchronized reset signal.

At step 202, the clock divider circuit (101) generates the sync loss pulse and provides the sync loss pulse to each serializer circuit. That is, the clock divider circuit (101) generates the sync loss pulse and publishes the sync loss pulse to each lane. As shown in FIG. 3A, the clock divider circuit (101) is placed common to each lane. Hence, the clock divider circuit (101) may provide the generated sync loss pulse to each lane. In some embodiments, the sync loss pulse is generated using the high-speed clock signal generated by the PLL (102). In some embodiments, the sync loss pulse may be generated in a frequency range similar to that of the parallel clock signal of the respective lanes. For example, if the parallel clock signal of Lane 1 ($104_1$) has a frequency of 250 MHz, then the sync loss pulse may be generated having the frequency of 250 MHz.

At step 203, the sampling circuit ($301_1$) generates a sampled sync loss signal by sampling the sync loss pulse. In some embodiments, the sampling circuit ($301_1$) may subscribe to the sync loss pulse published by the clock divider circuit (101). In some embodiments, the sampling circuit ($301_1$) may sample the sync loss pulse using the parallel clock signal and generate the sampled sync loss signal. Further, the sampling circuit ($301_1$) may assign a Boolean value to the sampled sync loss signal. For example, the Boolean "0" may be assigned for unsuccessful sampling and the Boolean "1" may be assigned for successful sampling. In another example, the Boolean "0" may be assigned for successful sampling and the Boolean "1" may be assigned for unsuccessful sampling. Likewise, the sampling circuit of each serializer circuit samples the sync loss pulse and assigns a respective Boolean value to respective sampled sync loss signals. Further, the sampling circuit ($301_1$) provides the sampled sync loss signal to the logic block (105). Likewise, each sampling circuit provides respective sampled sync loss signal to the logic block (105).

At step 204, the logic block (105) detects a sync loss when the sampled sync loss signal is out of sync from the sync loss pulse. The logic block (105) receives the sampled sync loss signal from the plurality of lanes ($104_1, \ldots 104_n$) and detects if any of the lanes is out of sync. The logic block (105) detects if any of the sampled sync loss signals has a Boolean value "0" (assuming that the Boolean "0" indicates unsuccessful sampling). If the Boolean "0" is detected, the logic block (105) may provide a signal to the PLL (102) to publish the sync reset signal. When the sync reset signal is published, plurality of lanes (104$_1$, . . . 104$_n$) operate from a predefined state. For example, let us consider that plurality of lanes (104$_1$, . . . 104$_n$) have received P parallel bits for serializing. The sync loss pulse is generated to identify if any of the lanes is out of sync from rest of the lanes. Each lane samples the sync loss pulse and generates the sampled sync loss signal. The logic block (105) receives the sampled sync loss signal from each lane to detect sync loss in any of the lanes. Let us consider that a sync loss is detected in Lane 3 (104$_3$) due to an ESD event and the sync reset signal is published to the plurality of lanes (104$_1$, . . . 104$_n$). Each of the plurality of lanes (104$_1$, . . . 104$_n$) discards the respective parallel data and the plurality of lanes (104$_1$, . . . 104$_n$) are configured to receive the P parallel bits again. As the plurality of lanes (104$_1$, . . . 104$_n$) receive the P bits, the plurality of lanes (104$_1$, . . . 104$_n$) are synchronized. Thus, the method according to an embodiment provides a method for identifying sync loss in any lane from the plurality of lanes (104$_1$, . . . 104$_n$) in the multi-lane transmitting apparatus (100) where the plurality of lanes (104$_1$, . . . 104$_n$) are arranged parallelly. In some embodiments, a width of the sync loss pulse is generated based on a skew margin between the plurality of serializer circuits (103$_1$, . . . 103$_n$).

Figure 4:
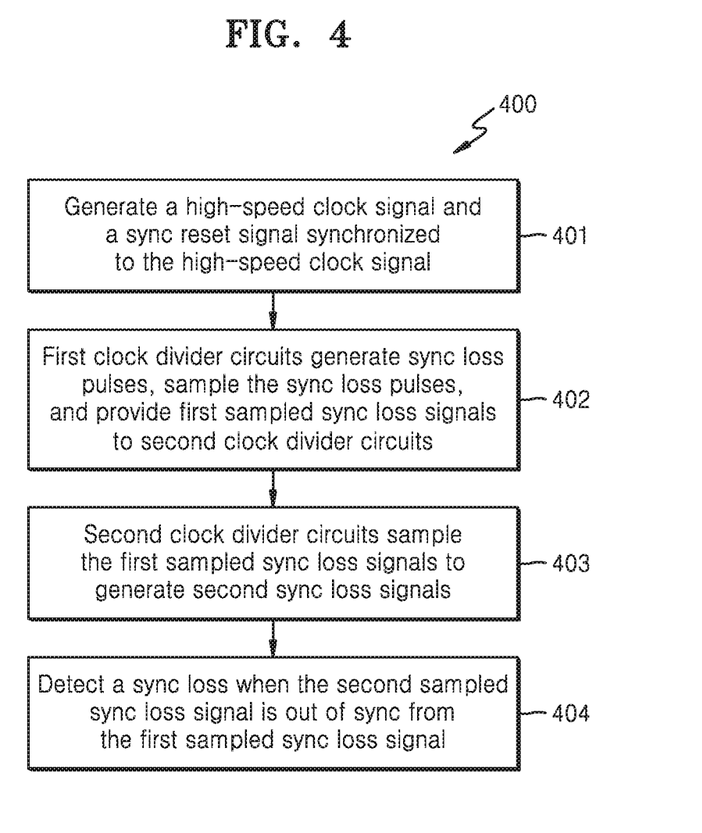
FIG. 4 shows a flowchart illustrating operations for detecting sync loss in a multi-lane transmitter having serially arranged lanes, according to some embodiments.

FIG. 4 shows a flowchart illustrating operations for detecting sync loss in a multi-lane transmitter having serially arranged lanes, according to an embodiment.

As illustrated in FIG. 4, the method (400) may comprise one or more steps. The method (400) may be described in the general context of computer executable instructions. Generally, computer executable instructions may include routines, programs, objects, components, data structures, procedures, modules, and functions, which, when executed by one or more processors, perform particular functions or implement particular abstract data types.

The order of the operations of the method (400) is described is not intended to be construed as a limitation, and any number of the described method blocks may be combined in any order to implement the method. Additionally, individual blocks may be deleted from the methods without departing from the scope of the subject matter described herein. Furthermore, the method may be implemented in any suitable hardware, software, firmware, or combination thereof.

Figure 6:
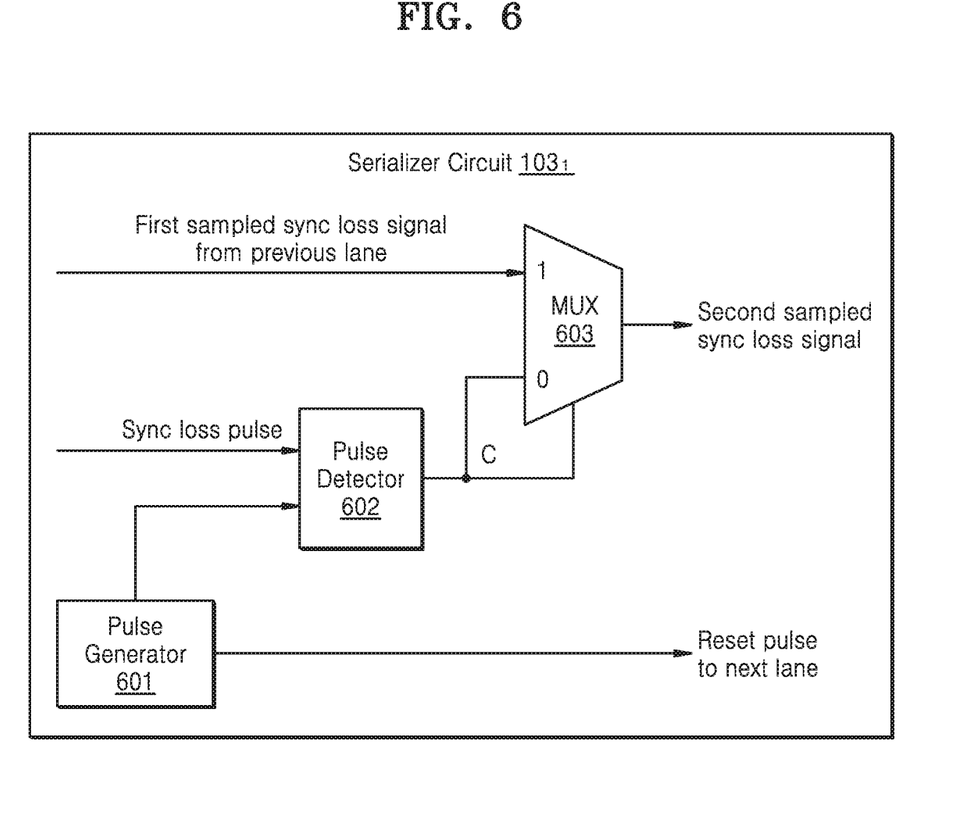
FIG. 6 shows a block diagram for sampling a sync loss pulse by a serializer circuit of a multi-lane transmitter, according to some embodiments.

The method (400) is implemented for the serial configuration of the plurality of lanes (104$_1$, . . . 104$_n$). The method steps (400) are explained in detail by making reference to FIG. 5. The serial configuration of the plurality of lanes (104$_1$, . . . 104$_n$) are as shown in FIG. 5. The configuration of FIG. 5 may be denoted as a Daisy chain configuration. In some embodiments of FIG. 5, the clock divider circuit (101) may be implemented in parallel clock generator (302) of each lane. FIG. 6 shows a simplified block diagram of internal elements of a clock divider circuit (101$_1$) (e.g., Lane 1 (104$_1$)). FIG. 6 is described with reference to Lane 1 (104$_1$). A person skilled in the art will understand that other lanes also comprises similar components and the description of FIG. 5 may be applicable for other lanes. In serial configuration, one half of the lanes among the plurality of lanes (104$_1$, . . . 104$_n$) are configured on a first side (e.g., left side) of the PLL (102) and the logic block (105), and the other half of the plurality of lanes (104$_1$, . . . 104$_n$) are configured on a second side (e.g., right side) of the PLL (102) and the logic block (105), as shown in FIG. 5. In some embodiments, a predefined number of lanes among the plurality of lanes (104$_1$, . . . 104$_n$) are configured on the first side (e.g., left side) of the PLL (102) and the logic block (105) and remaining lanes among the plurality of lanes (104$_1$, . . . 104$_n$) are configured on the second side (e.g., right side) of the PLL (102) and the logic block (105). As shown in FIG. 5, each lane (e.g., Lane 1 (104$_1$)) may comprise a serializer circuit (103$_1$) and a parallel clock generator (302) comprising a clock divider circuit (101). In such a configuration, the farthest lanes from the PLL (102) and the logic block (105) are Lane 2 104$_2$ and Lane 4 104$_4$ in the example shown in FIG. 5. In some embodiments, the clock divider circuits (101$_2$ and 101$_4$) of the farthest lanes (Lane 2 104$_2$ and Lane 4 104$_4$) are configured to generate the sync loss pulse. As shown, the PLL (102) may publish the high-speed clock signal to the plurality of lanes (Lane 1 104$_1$, . . . Lane n 104$_n$).

FIG. 6 shows the internal components of the serializer circuit (103$_1$) of a lane configured serially for detecting sync loss (e.g., Lane 1 104$_1$). The serializer circuit (103$_1$) may also comprise other components for generating serial bits from parallel bits. The other components are not shown in FIG. 6 for conciseness. The serializer circuit (103$_1$) comprises the sampling circuit (301$_1$) (not shown) for sampling the sync loss pulse. The sampling circuit (301$_1$) comprises a pulse generator (601$_1$), a pulse detector (602), and a multiplexer (603). The pulse generator (601) is configured to generate the a local pulse using the high-speed clock signal. The local pulse may be generated using a divider (/5, /10, /20). The pulse detector (602) pulse detector (602) may be configured to sample the sync loss pulse generated in the same lane. For example, the clock divider circuit (101$_1$) of Lane 1 (104$_1$) generates the sync loss pulse and provides the sync loss pulse to the serializer circuit (103$_1$) of the Lane 1 (104$_1$). Further, the serializer circuit (103$_1$) also receives the first sampled sync loss signal from Lane 2 (104$_2$). The serializer circuit (103$_1$) samples the sync loss pulse generated from the same lane and the sampled sync loss signal received from the previous lane and generates a second sampled sync loss signal. In some embodiments, the pulse detector (602) may also use the divider as used in the pulse generator (601). While sampling, if the clock signals of the sync loss pulse and the sampling signal in the pulse detector (602) are not synced, then the pulse detector (602) will return an output "0". If the clock signals of the sync loss pulse and the sampling signal in the pulse detector (602) are synced, then the pulse detector (602) will return an output "1". Further, the output of the detect is provided as an input to the mux (603). Also, output (sampled sync loss signal) from previous lane is provided as an input to the mux (603). Further, the output of the pulse detector (602) is also provided as an input to a select pin for the mux (603). The output of the mux (603) (first sampled sync loss pulse) is provided to the logic block (105). The different values of the output of the mux (603) is provided in the below Table 1:

TABLE 1

| Mux input from detect | Mux input from previous lane | Select pin (detect output) | Mux output |
|---|---|---|---|
| 0 | 0 | 0 | 0 |
| 0 | 1 | 0 | 0 |
| 1 | 0 | 1 | 0 |
| 1 | 1 | 1 | 1 |

For select pin=1; output=mux input from previous lane;
For select pin=0; output=mux input from detect;

The mux (603$_1$) is configured to generate a sampled sync loss signal. In some embodiments, the sampled sync loss signal generated by the farthest lanes (Lane 2 $104_2$ and Lane 4 $104_4$) may be denoted as first sampled sync loss signals.

Referring back to FIG. 4, at step 401, a high-speed clock signal and a synchronized reset signal that is synchronized to the high-speed clock signal are generated by the PLL (102). The high-speed clock signal and the synchronized reset signal are published by the PLL (102) to the plurality of lanes (Lane 1 $104_1$, . . . Lane n $104_n$).

At step 402, the first clock divider circuits ($101_2$ and $101_4$) of the farthest lanes (Lane 2 $104_2$ and Lane 4 $104_4$) generate sync loss pulses, sample the sync loss pulses, and provide first sampled sync loss signals to second clock divider circuits. In some embodiments, the first clock divider circuits ($101_2$ and $101_4$) may not sample the sync loss pulse. In some embodiments, the first clock divider circuits ($101_2$ and $101_4$) may sample the sync loss pulse. In some embodiments, if the first clock divider circuits ($101_2$ and $101_4$) sample the sync loss pulse, the output is denoted as first sampled sync loss signal. In some embodiments, if the first clock divider circuits ($101_2$ and $101_4$) do not sample the sync loss pulse, then the output is denoted as first sync loss pulse. Further explanation is provided considering the first clock divider circuits ($101_2$ and $101_4$) have sampled the sync loss pulse. Each of the first clock divider circuit ($101_2$ and $101_4$) provides the sampled sync loss signal to series connected lanes. That is the clock divider circuit ($101_2$) provides its first sampled sync loss signal to the series connected clock divider circuit ($101_1$) of Lane 1 ($104_1$). Likewise, the clock divider circuit ($101_4$) provides its first sampled sync loss signal to the series connected clock divider circuit ($101_3$) of Lane 3 ($104_3$). The clock divider circuits ($101_1$ and $101_3$) may be denoted as second clock divider circuits ($101_1$ and $101_3$). Likewise, the lanes ($104_1$ and $104_3$) may be referred as second lanes. In some embodiments, the first sampled sync loss signals may be assigned a predefined Boolean value ("0" or "1").

At step 403, the second clock divider circuits ($101_1$ and $101_3$) sample the first sampled sync loss signals to generate second sync loss signals. The second clock divider circuits ($101_1$ and $101_3$) receive the first sampled sync loss signals and sample the first sync loss signals using the parallel clock of the respective lanes to generate respective second sampled sync loss signals. Each of the second sync loss signals may be assigned a Boolean value based on the outcome of the sampling. For example, the Boolean "0" may be assigned for unsuccessful sampling and the Boolean "1" may be assigned for successful sampling. In another example, the Boolean "0" may be assigned for successful sampling and the Boolean "1" may be assigned for unsuccessful sampling. Likewise, the sampled sync loss signals is propagated throughout the series connected lanes.

At step 404, the logic block (105) detects a sync loss when the second sampled sync loss signal is out of sync from the first sampled sync loss signal. For example, the logic block (105) receives the last sampled sync loss signal (second sampled sync loss signal in case of FIG. 5) and determines if there is sync loss in any of the lanes. Based on the Boolean value of the last sampled sync loss signal, the logic block (105) detects the sync loss. In some embodiments, if a sync loss is detected, the logic block (105) generates a signal to enable the PLL (102) to publish the synchronized reset signal to the plurality of lanes ($104_1$, . . . $104_n$). Once the synchronized reset signal is published, the serializer circuit (103) in each lane is configured to operate from a predefined state. Thus, the sync loss is detected in the daisy chain architecture of the lanes in the multi-lane transmitting apparatus (100).

Figure 7A:
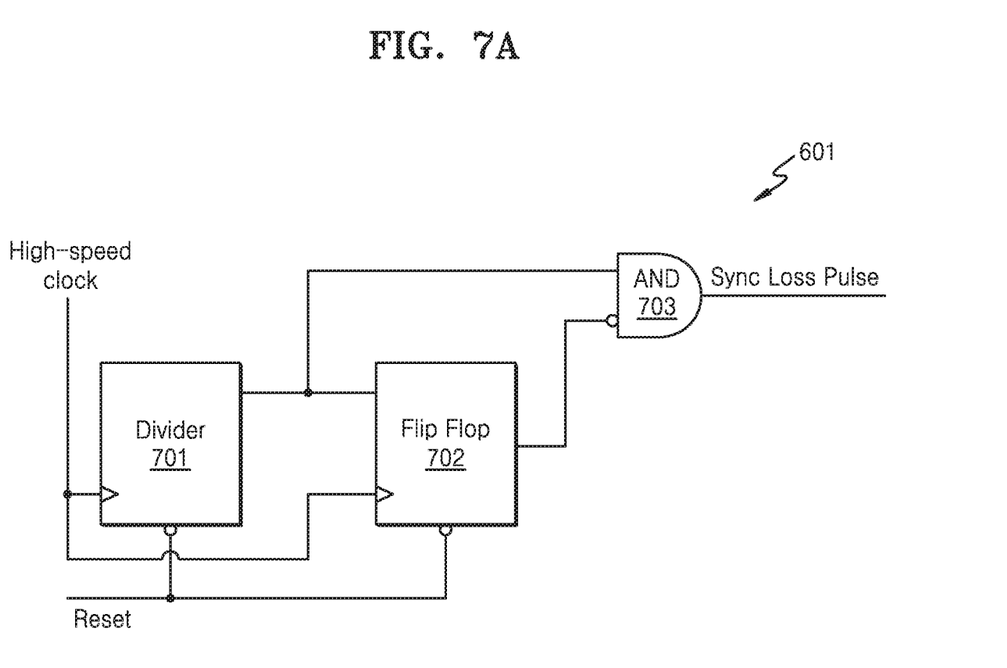
FIG. 7A shows an exemplary block diagram of a pulse generator for generating a sync pulse, according to some embodiments.

FIG. 7A shows an exemplary logic diagram of a pulse generator, according to an embodiment. A pulse generator (601) is configured to generate the sync loss pulse. As shown, the pulse generator (601) comprises a divider (701), a flip flop (702) and an AND gate (703). The output of the AND gate (703) is the sync loss pulse. The divider (701) is configured to receive the high-speed clock signal as input. The divider (701) is configured to divide the high-speed clock signal to a divided clock signal. The divider (701) may implement a /5 counter or a /10 counter or a /20 counter to generate the divided clock signal. In some embodiments, the divider (701) may implement a suitable counter to generate the divided clock signal. The divided clock frequency is provided to the flip flop (702) as an input and the high-speed clock signal acts as clock input to the flip flop (702). The output of the flip flop (702) is provided to the AND gate (703). Also, the AND gate (703) receives an input from the divider (701). In some embodiments, the serializer circuit ($103_1$) may also comprise a similar circuit as shown in FIG. 7A to generate the local pulse.

Figure 7B:
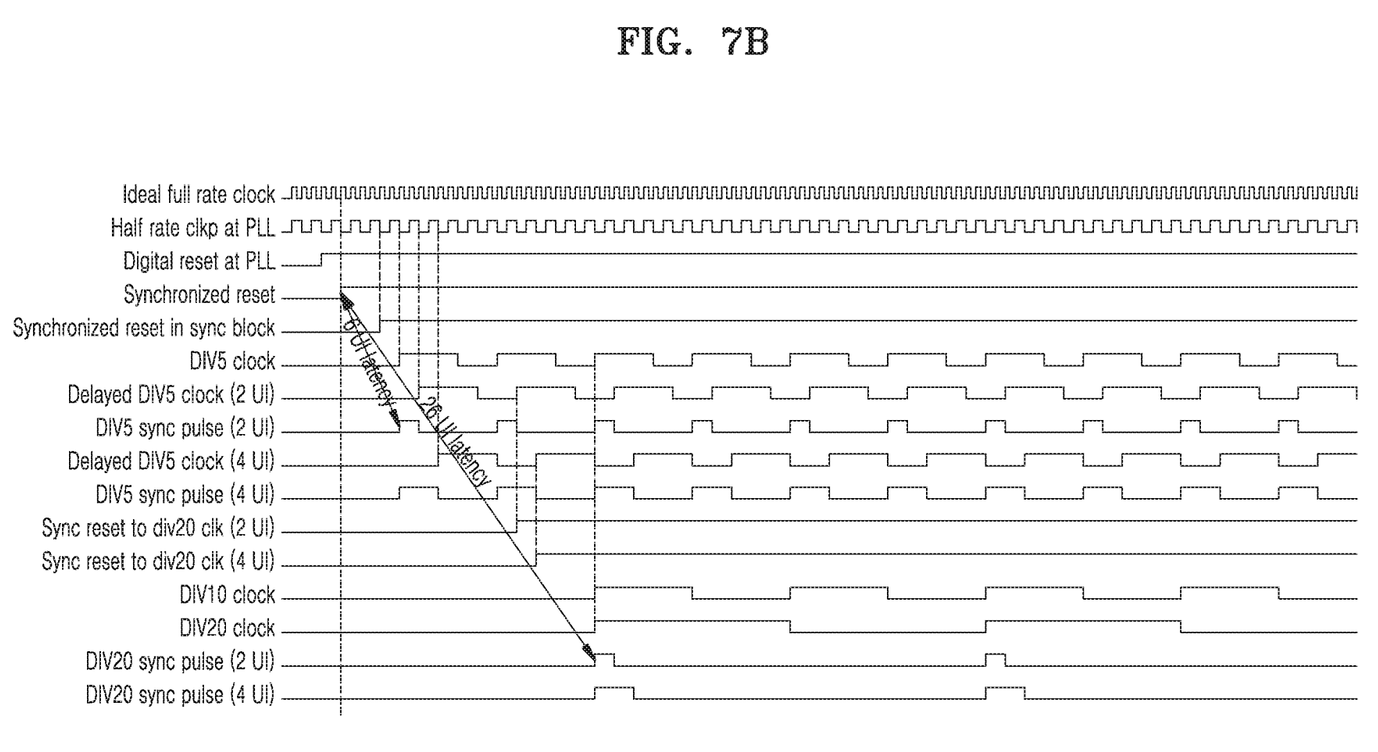
FIG. 7B illustrates waveforms of a sync pulse for detecting sync loss in a multi-lane transmitter, according to some embodiments.

FIG. 7B shows the waveforms for generating the sync loss pulse, according to an embodiment. As shown in FIG. 7B, an ideal full rate clock signal is the high-speed clock signal generated by the PLL (102). A /5 clock signal is generated as shown in the FIG. 7B. Further, the /5 clock signal is delayed using the flip flop (702). As shown in the FIG. 7B, a delayed /5 clock signal (2 UI or 1 clock unit) is generated. In the implementation as shown in the FIG. 3, the sync loss pulse is provided to each lane. In the implementation as shown in the FIG. 5, the sync loss pulse may be generated by each lane.

Figure 8A:
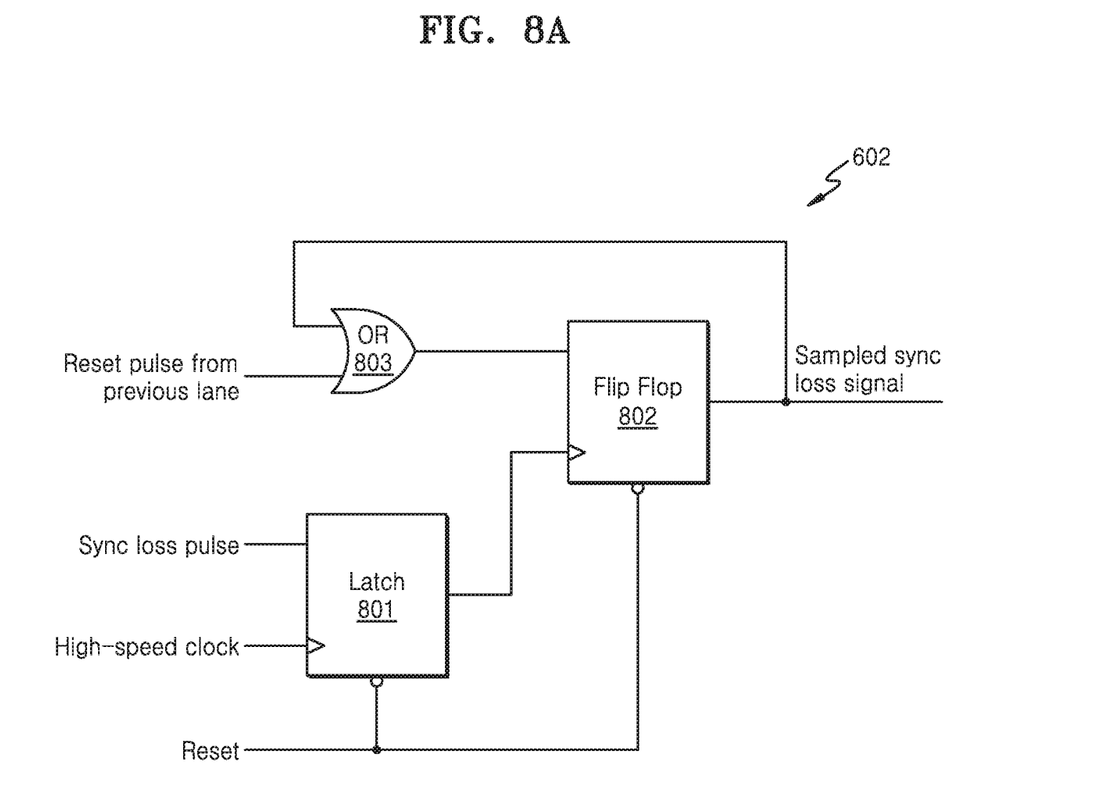
FIG. 8A shows an exemplary block diagram of a pulse detector for sampling a sync pulse, according to some embodiments.

FIG. 8A shows an exemplary logic diagram of a pulse detector, according to an embodiment. A pulse detector (602) comprises a latch (801), a flip flop (802) and an OR gate (803). The pulse detector (602) is configured to sample the sync loss pulse. In some embodiments, the sync loss pulse generated by the pulse generator (601) is provided to the latch (801). Also, the high-speed clock signal is provided to the latch as an enable signal. The output of the latch is provided as a clock input to the flip flop (802). The flip flop receives an input from the OR gate (803). The input of the OR gate (803) is connected to the output of the flip flop (802). The flip flop (802) is used to sample the sync loss pulse. In the implementation as shown in the FIG. 3, the flip flop (802) of a lane uses the divided clock signal generated by the lane to sample the sync loss pulse. Here, the output of the pulse detector (602) in all the lanes are provided to the logic block (105). In the implementation of as shown in the FIG. 5, the flip flop (802) of a lane uses the sampled sync loss signal of previous lane to sample the sync loss signal generated by the lane. Here, the output of the pulse detector (602) is provide to series connected lane.

Figure 8B:
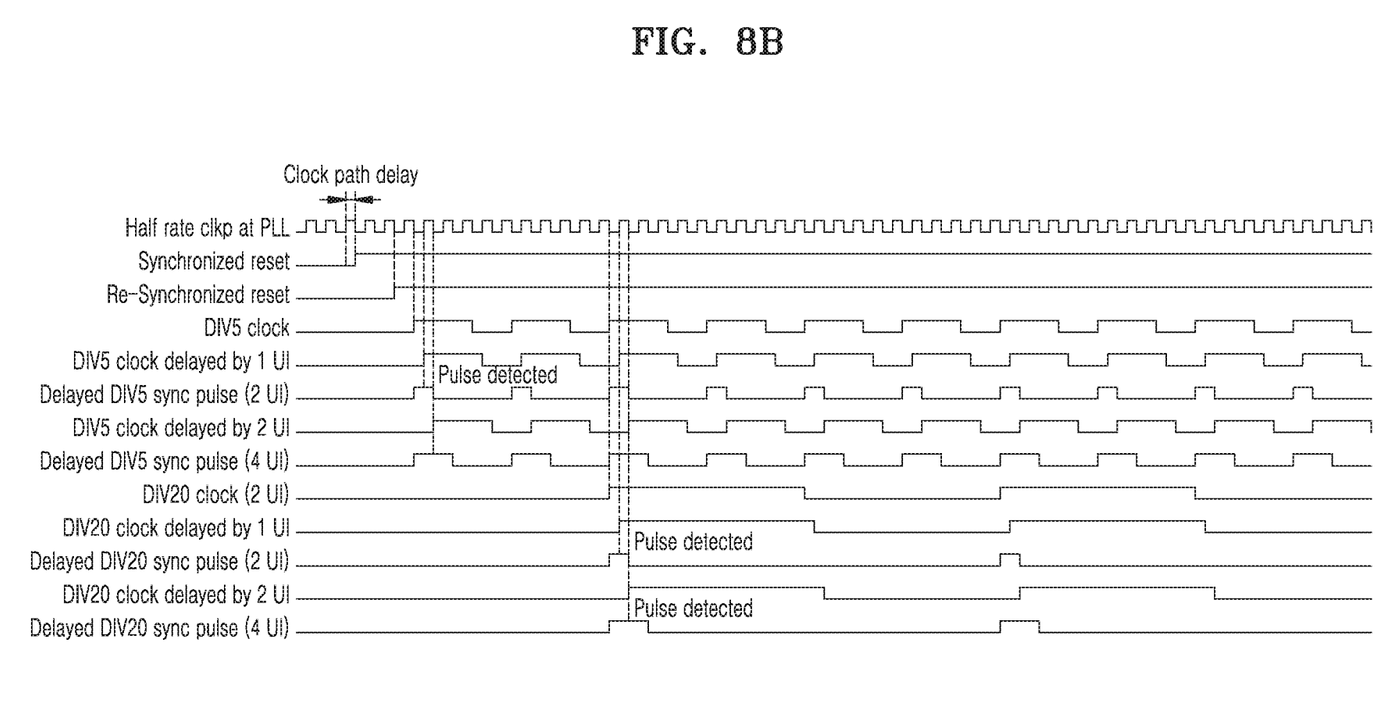
FIG. 8B illustrates waveforms of sampling a sync pulse for detecting sync loss in a multi-lane transmitter, according to some embodiments.

FIG. 8B shows the waveforms for detecting the sync loss pulse, according to an embodiment. As shown in FIG. 8B, a delayed sync loss pulse is detected using the dotted lines. As the delayed sync loss pulse is HIGH for a short duration and is LOW for a longer duration, the output of the pulse detector (602) is high only when the divided clock signals of the pulse detector (602) are synced with the delayed sync loss pulse. For example, when the divided clock signal is HIGH at time t1 and the delayed sync loss pulse is LOW at time t1, then the output of the pulse detector is "0". Likewise, when the divided clock signal is HIGH at time t1 and the delayed sync loss pulse is HIGH at time t1, then the output of the pulse detector is "1".

In some embodiments, the logic block (105) may be implemented in each lane (104). In some embodiments, when the logic block (105) is implemented in each lane, the sync loss may be detected early and the plurality of lanes ($104_1, \ldots 104_n$) may be reset immediately.

In some embodiments, the present disclosure enables sync between the plurality of lanes ($104_1, \ldots 104_n$) even during ESD events.

In some embodiments, the present disclosure provides a sophisticated approach of detecting sync loss in a multi-lane transmitting apparatus (100).

The terms "an embodiment", "embodiment", "embodiments", "the embodiment", "the embodiments", "one or more embodiments", "some embodiments", and "one embodiment" mean "one or more (but not all) embodiments" unless expressly specified otherwise.

The terms "including", "comprising", "having" and variations thereof mean "including but not limited to", unless expressly specified otherwise.

The enumerated listing of items does not imply that any or all of the items are mutually exclusive, unless expressly specified otherwise. The terms "a", "an" and "the" mean "one or more", unless expressly specified otherwise.

A description of some embodiments with several components in communication with each other does not imply that all such components are required. On the contrary a variety of optional components are described to illustrate the wide variety of possible embodiments of the invention.

When a single device or article is described herein, it will be readily apparent that more than one device/article (whether or not they cooperate) may be used in place of a single device/article. Similarly, where more than one device or article is described herein (whether or not they cooperate), it will be readily apparent that a single device/article may be used in place of the more than one device or article or a different number of devices/articles may be used instead of the shown number of devices or programs. The functionality and/or the features of a device may be alternatively embodied by one or more other devices which are not explicitly described as having such functionality/features. Thus, other embodiments need not include the device itself.

The illustrated operations of FIG. 2, and FIG. 4 show certain events occurring in a certain order. In alternative embodiments, certain operations may be performed in a different order, modified or removed. Moreover, steps may be added to the above described logic and still conform to the described embodiments. Further, operations described herein may occur sequentially or certain operations may be processed in parallel. Yet further, operations may be performed by a single processing unit or by distributed processing units.

Finally, the language used in the specification has been principally selected for readability and instructional purposes, and it may not have been selected to delineate or circumscribe the inventive subject matter. It is therefore intended that the scope of the present disclosure be limited not by this detailed description, but rather by any claims that issue on an application based here on. Accordingly, the disclosure of the embodiments is intended to be illustrative, but not limiting, of the scope of the inventive concept, which is set forth in the following claims.

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

What is claimed is:

1. A method of detecting synchronization (sync) loss in a multi-lane transmitting apparatus for a high speed serial interface application, wherein the multi-lane transmitting apparatus comprises a Phase Locked Loop (PLL) circuit, a plurality of serializer circuits, a common clock divider circuit and a logic block, the method comprising:
   generating, by the PLL circuit, a high-speed clock signal and a sync reset signal synchronized to the high-speed clock signal;
   generating, by the common clock divider circuit, a sync loss pulse based on the high-speed clock signal, wherein the sync loss pulse is provided to each of the plurality of serializer circuits;
   generating, by each of the plurality of serializer circuits, a sampled sync loss signal by sampling the sync loss pulse in accordance with a parallel clock signal, wherein a Boolean value is assigned to the sampled sync loss signal and output;
   detecting, by the logic block, a sync loss in the multi-lane transmitting apparatus when a sampled sync loss signal of at least one serializer circuit of the plurality of serializer circuits is out of sync from the sync loss pulse based on the Boolean value.

2. The method as claimed in claim 1, wherein a width of the sync loss pulse is generated based on a skew margin between the plurality of serializer circuits.

3. The method as claimed in claim 1, wherein a frequency of the sync loss pulse is set to a defined divided clock frequency.

4. The method as claimed in claim 1, wherein each of the plurality of serializer circuits comprises a parallel clock generator, and the parallel clock signal of each serializer circuit is generated by the parallel clock generator of the serializer circuit.

5. The method as claimed in claim 1, wherein the sync reset signal is asserted and de-asserted to synchronize each serializer circuit in a beginning of a transmission and in response to detecting the sync loss in the multi-lane transmitting apparatus.

6. The method as claimed in claim 1, wherein the sync reset signal is asserted and de-asserted to synchronize the common clock divider circuit with each serializer circuit in response to the common clock divider circuit being out of sync with at least one of the serializer circuits.

7. The method as claimed in claim 1, further comprising:
   receiving, by the logic block, the Boolean value from each serializer circuit; and
   performing, by the logic block, a logic function on each Boolean value, wherein in response to a result of the logic function having a predefined Boolean value, the sync loss is detected in the multi-lane transmitting apparatus.

8. The method as claimed in claim 1, wherein the sync reset signal is provided to each serializer circuit in response to detecting the sync loss, and
   wherein in response to receiving the sync reset signal, each serializer circuit is configured to operate from a predefined operating state.

9. The method as claimed in claim 1, wherein the sync loss is due to an Electro-static Discharge (ESD) event.

10. A multi-lane transmitting apparatus for detecting synchronization (sync) loss, the multi-lane transmitting apparatus comprising:
   a Phase Locked Loop (PLL) circuit configured to generate a high-speed clock signal, and a sync reset signal synchronized to the high-speed clock signal;

a plurality of serializer circuits, each serializer circuit comprising a parallel clock generator and configured to serialize a plurality of parallel data into serial data, generate a sampled sync loss signal by sampling a sync loss pulse in accordance with a parallel clock signal generated by the parallel clock generator, and assign a Boolean value to the sampled sync loss signal and output the Boolean value; a common divider circuit configured to generate the sync loss pulse based on the high-speed clock signal, wherein the sync loss pulse is provided to each of the plurality of serializer circuits; and a logic block configured to detect a sync loss in the multi-lane transmitting apparatus when a sampled sync loss signal of at least one serializer circuit is out of sync from the sync loss pulse based on the Boolean value output from each serializer circuit, wherein the sync reset signal is provided to each serializer circuit in response to detecting the sync loss, and wherein in response to receiving the sync reset signal, each serializer circuit is configured to operate from a predefined operating state.

11. The multi-lane transmitting apparatus as claimed in claim 10, wherein the common divider circuit is configured to generate the sync loss pulse having a width based on a skew margin between each serializer circuit.

12. The multi-lane transmitting apparatus as claimed in claim 11, wherein the logic block is configured to assert and de-assert the sync reset signal to the common divider circuit, in response to the PLL circuit being out of sync with at least one of the serializer circuits.

13. The multi-lane transmitting apparatus as claimed in claim 10, wherein the common divider circuit is configured to set a frequency of the sync loss pulse to a defined divided clock frequency.

14. The multi-lane transmitting apparatus as claimed in claim 10, wherein the logic block is configured to assert and de-assert the sync reset signal to synchronize each serializer circuit in a beginning of a transmission and in response to detecting the sync loss in the multi-lane transmitting apparatus.

15. The multi-lane transmitting apparatus as claimed in claim 10, wherein the logic block is configured to:
  receive the Boolean value output from each serializer circuit; and
  perform a logic function using each Boolean value, wherein in response to result of the logic function having a predefined Boolean value, the sync loss is detected in the multi-lane transmitting apparatus.

16. The multi-lane transmitting apparatus as claimed in claim 10, wherein the PLL circuit is configured to provide the sync reset signal to each serializer circuit in response to detecting the sync loss, and
  wherein in response to receiving the sync reset signal, each serializer circuit is configured to operate from the predefined operating state.

17. The multi-lane transmitting apparatus as claimed in claim 10, wherein the sync loss is due to an Electro-static Discharge (ESD) event.

18. A method of detecting synchronization (sync) loss in a multi-lane transmitting apparatus for high speed serial interface application, wherein the multi-lane transmitting apparatus comprises a Phase Locked Loop (PLL) circuit, a logic block, a plurality of lanes. each lane comprising a serializer circuit, a clock divider circuit, and a parallel clock generator, the method comprising:
  generating, by the PLL circuit, a high-speed clock signal and a sync reset signal synchronized to the high-speed clock signal, wherein the high-speed clock signal is provided to each serializer circuit;
  generating, by a first clock divider circuit of a first lane of the plurality of lanes, a sync loss pulse based on the high-speed clock signal, wherein the sync loss pulse is sampled to generate a first sampled sync loss signal and the first sampled sync loss signal is provided to a second clock divider circuit of a second lane of the plurality of lanes connected in series with the first lane;
  generating, by the second clock divider circuit, a second sampled sync loss signal by sampling the first sampled sync loss signal received from the first clock divider circuit using a parallel clock signal of the second lane, wherein each of the first sampled sync loss signal and the second sampled sync loss signal is assigned a Boolean value; and
  detecting, by a logic block associated with the second lane, a sync loss in the second lane when the second sampled sync loss signal is out of sync from the first sampled sync loss signal based on the Boolean value assigned to the first sampled sync loss signal and the Boolean value assigned to the second sampled sync loss signal.

19. The method as claimed in claim 18, wherein the sync reset signal is asserted and de-asserted to synchronize each serializer circuit in a beginning of a transmission and in response to detecting the sync loss in the multi-lane transmitting apparatus.

20. The method as claimed in claim 18, wherein the sync loss is due to an Electro-static Discharge (ESD) event.

* * * * *